(12) United States Patent
Naβ et al.

(10) Patent No.: US 7,655,859 B2
(45) Date of Patent: Feb. 2, 2010

(54) CONNECTOR FOR A SOLAR MODULE

(75) Inventors: Andreas Naβ, Warmsen (DE); Dirk-Peter Post, Lübbecke (DE); Martin Schmidt, Lübbecke (DE); Ludger Sorig, Ascheberg (DE); Hartwig Stein, Scheuring (DE)

(73) Assignee: Harting Electric GmbH & Co. KG (DE)

( * ) Notice: Subject to any disclaimer, the term of this patent is extended or adjusted under 35 U.S.C. 154(b) by 652 days.

(21) Appl. No.: 10/883,103

(22) Filed: Jul. 1, 2004

(65) Prior Publication Data
US 2005/0022859 A1    Feb. 3, 2005

(30) Foreign Application Priority Data
Jul. 31, 2003    (DE) ................ 103 34 935

(51) Int. Cl.
*H01L 25/00* (2006.01)
(52) U.S. Cl. .................. 136/243; 439/135; 439/374
(58) Field of Classification Search ............ 136/244
See application file for complete search history.

(56) References Cited

U.S. PATENT DOCUMENTS

| | | | | |
|---|---|---|---|---|
| 4,283,106 A | | 8/1981 | Bunnell ................... 339/125 R |
| 4,457,578 A | | 7/1984 | Taylor .................... 339/263 R |
| 4,460,232 A | * | 7/1984 | Sotolongo ................... 439/535 |
| 5,110,369 A | * | 5/1992 | Tornstrom et al. .......... 136/251 |
| 5,137,461 A | * | 8/1992 | Bindra et al. ................ 439/74 |
| 5,201,855 A | * | 4/1993 | Ikola ..................... 439/607.14 |
| 5,268,038 A | | 12/1993 | Riermeier et al. ........... 136/251 |
| 5,503,684 A | | 4/1996 | Duran ........................ 136/251 |
| 5,951,785 A | * | 9/1999 | Uchihashi et al. ........... 136/251 |
| 6,072,190 A | * | 6/2000 | Watanabe et al. ............. 257/48 |
| 6,235,984 B1 | | 5/2001 | Wambach et al. ........... 136/256 |
| 6,419,504 B1 | * | 7/2002 | Nelson ....................... 439/103 |
| 6,462,265 B1 | * | 10/2002 | Sasaoka et al. ............. 136/251 |

FOREIGN PATENT DOCUMENTS

| | | |
|---|---|---|
| EP | 1 006 593 | 9/2000 |
| JP | 2000174314 | 6/2000 |
| JP | 2000-133356 | * 12/2000 |
| JP | 2000357812 | 12/2000 |

* cited by examiner

*Primary Examiner*—Jennifer K Michener
*Assistant Examiner*—Miriam Berdichevsky
(74) *Attorney, Agent, or Firm*—Hayes Soloway P.C.

(57) ABSTRACT

In order to deliver the current generated by means of photovoltaic solar elements, the invention proposes a connector for a solar module that is accommodated in a connector housing and can be connected to the solar elements. The solar elements are interconnected by means of flat connecting lines and embedding in a translucent sandwich panel. The current is delivered through an opening in one of the sheets of the sandwich panel by means of springable contact elements that are in electric contact with the connecting lines of the solar elements.

9 Claims, 9 Drawing Sheets

CONNECTOR FOR A SOLAR MODULE

TECHNICAL FIELD

The invention pertains to a connector for a solar module that is arranged in a connector housing and serves for connecting an electric service cable to electric connecting lines of the solar module that are arranged with translucent sandwich panels and serve for electrically interconnecting several photovoltaic solar elements.

BACKGROUND OF THE INVENTION

A connector of this type is required for delivering the solar electricity generated by photovoltaic solar elements in a solar module to a consumer via a service cable.

A plate-shaped photovoltaic solar module with an outer plate and an inner plate, as well as a plastic layer with embedded solar cells, is known from EP 1 006 593 A1. The connector of this solar module consists of a plug-and-socket connector that is arranged in an opening in the inner plate and permanently connected to several connecting lines of the solar cells.

BRIEF SUMMARY OF THE INVENTION

The disadvantage of such an arrangement is that a permanent connection of this type needs to be soldered or welded and is quite complicated and expensive to produce.

The invention is based on the objective of developing a connector of the initially described type in such a way that separable electric connections between the connecting lines of solar modules and electric service cables can be easily and inexpensively produced without requiring tools.

This objective is attained in that the ends of the connecting lines are partially supported by a reinforcing element, and in that the connecting lines can be respectively contacted by a contact pin in the region of the support realized with the reinforcing element.

The advantages attained with the invention can be seen, in particular, in that the contact pins with a pyramid-shaped surface structure make it possible to realize a direct and gas-tight contact with the flat electric connecting lines that are arranged within the solar module and serve for electrically interconnecting the individual photovoltaic solar elements that are embedded in a sandwich panel.

The connecting lines are supported by a reinforcing element because they consist of copper and consequently are relatively soft with respect to compressive connection methods. This means that the connecting lines that are additionally placed into a relatively soft plastic layer within the sandwich panel exert a corresponding back pressure upon the contact pin.

In this context, it is particularly advantageous that the contact pins are held on a spring element and thusly exert a constant pressure upon the connecting lines such that excessive contact resistances are prevented.

The reinforcing elements are also provided with catch elements that are engaged with catch elements of an insulating contact plate.

The contact plate contains an integral base plate that is held between the sheets, wherein a collar-shaped connecting part of the contact plate makes it possible to produce a connection with a connector housing in a recess in one of the sheets by attaching the connector housing to the recess.

In this case, the contact pins are springably held in the connector housing and pressed against the connecting lines in the sandwich panel. Since the height of the contact plate within the sandwich panel does not exceed the height of the outer sheet or, in the other words, does not protrude over this outer sheet, several sheets with solar modules can be stacked directly on top of one another in order to be stored or transported, namely because only a protective cap initially covers and protects the recess from the admission of dirt and the like. This protective cap is removed after the assembly of the solar module and replaced with the connector housing.

However, it is preferred to reduce the total height of the contact plate such that the connector housing with a collar attached thereon can be accommodated in the recess in the sandwich panel in a polarized fashion.

The contact pins are connected to a printed circuit board arranged in the connector housing in an electrically conductive fashion, wherein the printed circuit board is electrically connected to a connector plug that advantageously consists of a quick-connector for producing a connection with an external service cable without requiring tools and is realized in the form of a cage strain terminal.

The connector housing with the contact pins is advantageously realized in the form of a splash water-proof and dust-proof variation in order to ensure a reliable electric connection between the solar elements and a consumer independently of environmental influences.

BRIEF DESCRIPTION OF THE DRAWINGS

One embodiment of the invention is illustrated in the figures and described in greater detail below. The figures show.

DETAILED DESCRIPTION OF THE PREFERRED EMBODIMENT

Figure 1:
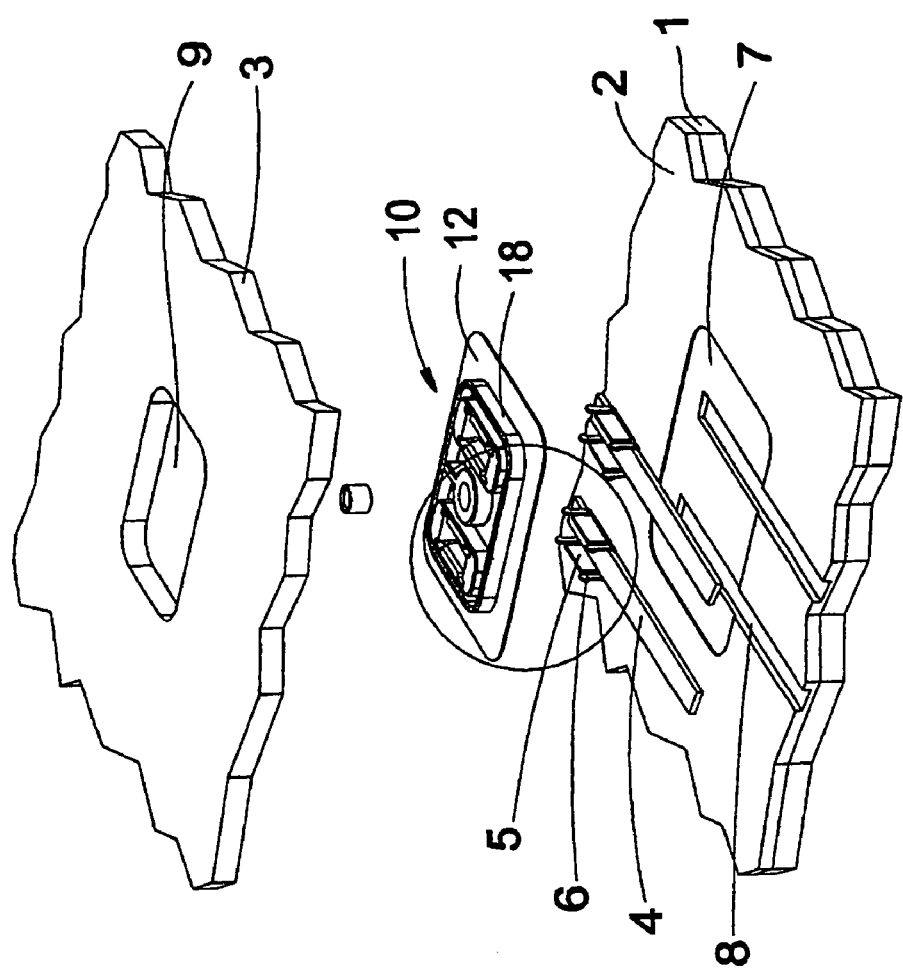
FIG. 1, the installation of a contact plate into a sandwich panel of a solar module.

FIG. 1 shows a translucent sandwich panel of a solar module that consists of an outer sheet 1 and an inner sheet 3, between which a plastic layer 2 is arranged. Photovoltaic solar elements (not shown in the figure) are embedded in this plastic layer.

Flat connecting lines 4 lead from the solar elements to a central supply terminal, on which a contact plate 10 in the form of a flat housing part is arranged.

The connecting lines 4 are inserted into channels 8 in the plastic layer 2 and partially encompassed by reinforcing elements 5 on their ends.

The contact plate 10 is realized in the form of a flat, rectangular part and comprises a base plate 12, on which a structure of different shapes is arranged and surrounded by a collar 18.

The contact plate is placed on the plastic layer 2 above the connecting lines 4, namely in a depression 7 that corresponds to the base plate. The catch means 6 provided on the reinforcing elements 5 respectively engage on an undercut 16 in the contact plate.

Figure 2:
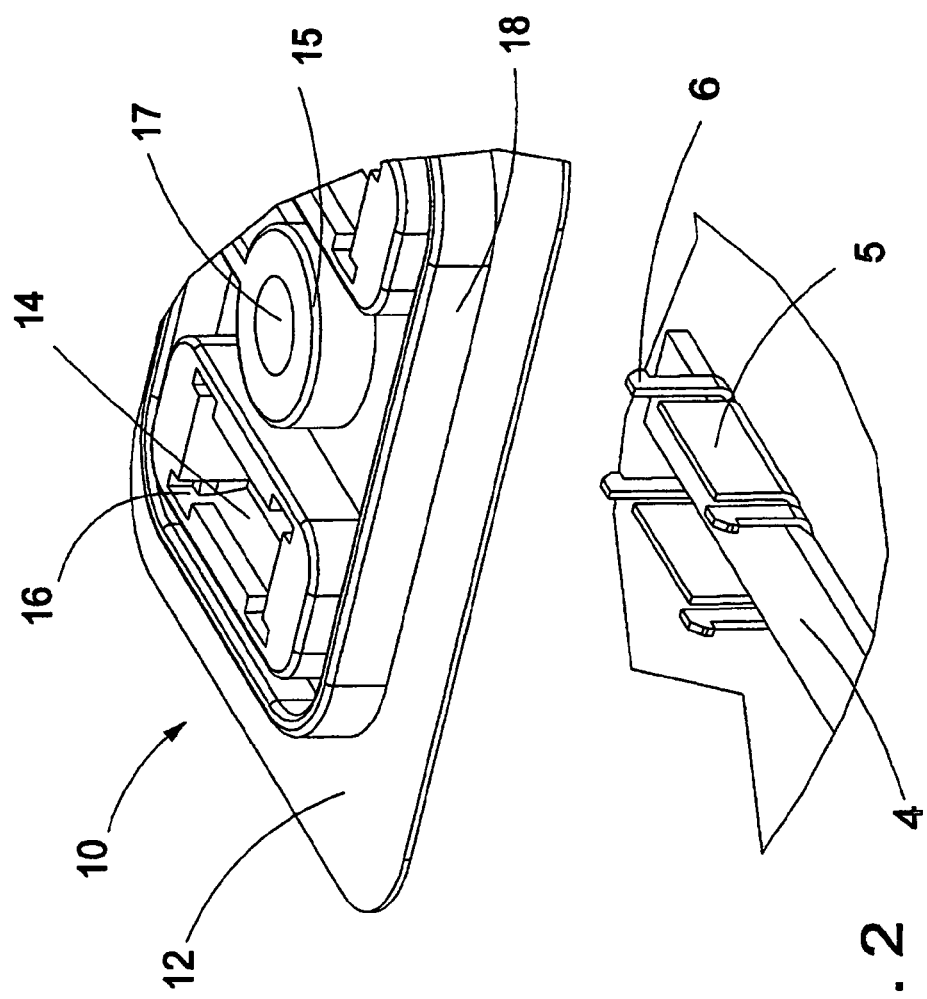
FIG. 2, a detailed representation of the contact plate.

FIG. 2 shows an enlarged detail of FIG. 1, wherein a reinforcing element 5 is inserted into a rectangular recess 14 in the contact plate 10 and the catch hooks 6 that are cut out along three sides can be respectively engaged on an undercut 16. In this case, two recesses 14 for the connection of two connecting lines 4 are provided. An additionally provided polarization element 15 is realized in the form of a circular ring with a web attached thereto and contains a threaded bore 17 in its center (see also FIG. 3).

The assembly of the sandwich panel is completed after the upper sheet 3 is attached in a precisely fitted fashion to the region in which the contact plate 10 is fixed on the plastic layer 2 with the recess 9.

The recess can be covered with a protective cap or the like in order to prevent the admission of dirt during the transport of the sandwich panel. In this case, it is ensured that the maximum height of the contact plate 10 does not exceed the sheet thickness. The height of the collar is normally smaller than the thickness of the sheet 3 of the sandwich panel.

Figure 3:
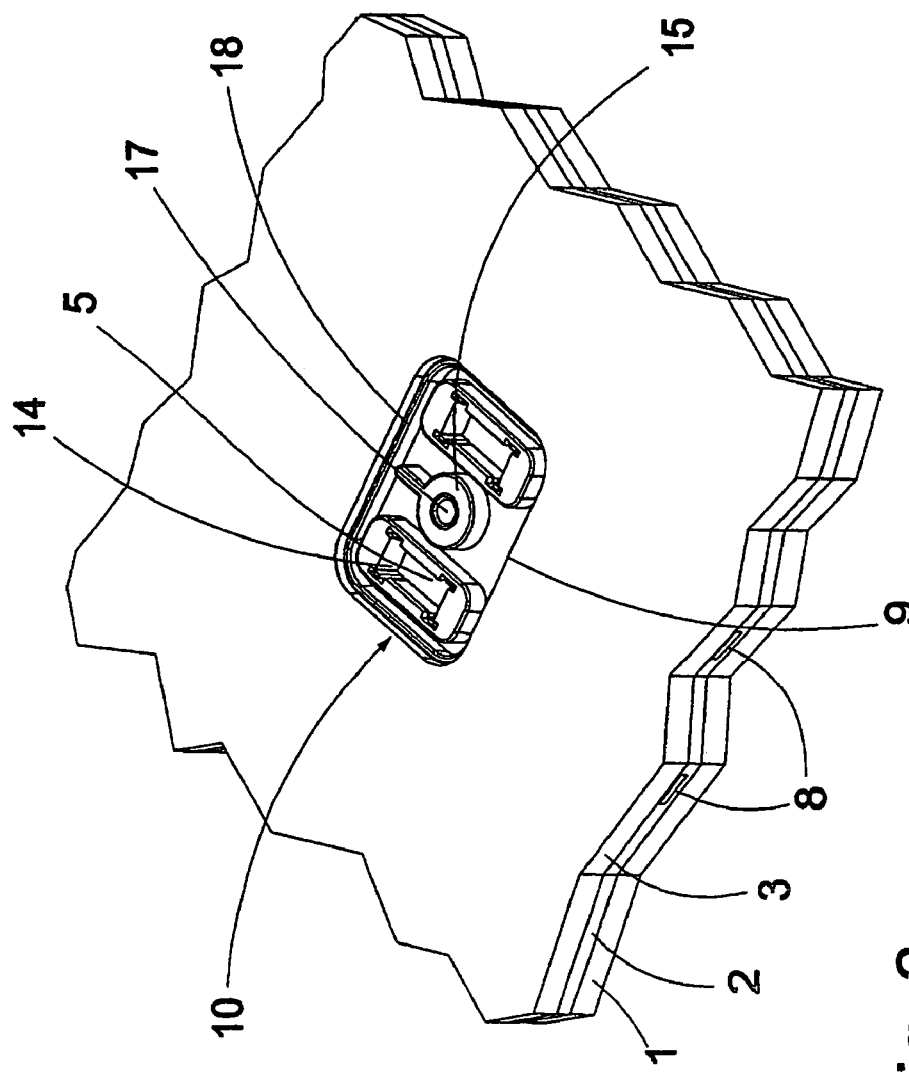
FIG. 3, a contact plate that is completely installed in the sandwich panel.

FIG. 3 shows a completely assembled sandwich panel with the contact plate 10. This figure shows the rectangular recesses 14, into which the reinforcing elements 5 engage, as well as the polarization 15 with the central threaded bore 17. The polarization is realized in the form of a circular ring with a narrow web attached thereto such that a connector housing with a corresponding negative polarization can only be inserted in one position.

Figure 4:
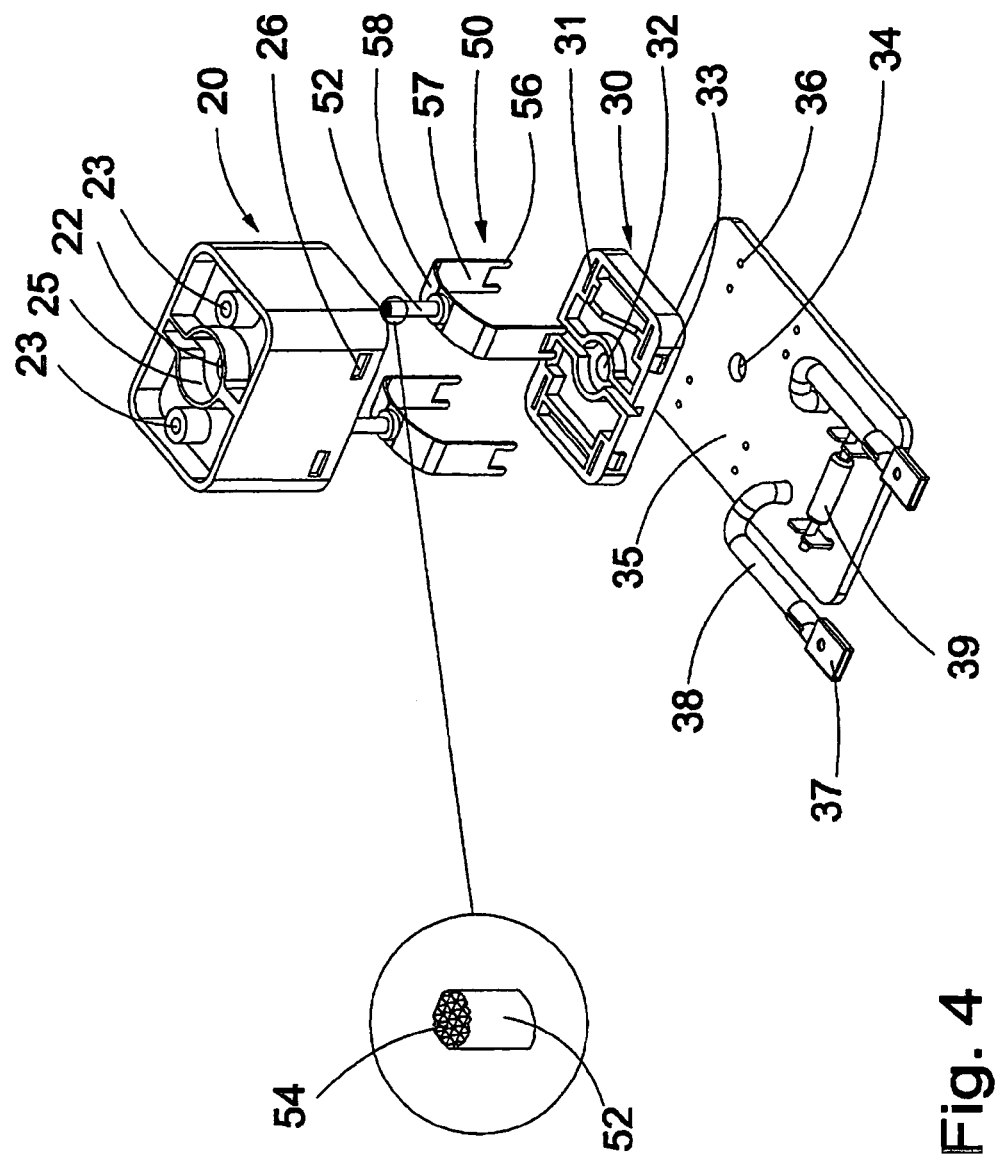
FIG. 4, an exploded view of the contact housing.

FIG. 4 shows an exploded view of a contact housing 20 that holds contact elements 50, as well as a cover plate 30 for closing the contact housing and a printed circuit board 35. The contact element 50 consists of a U-shaped spring element 57, on the arc section 58 of which a contact pin 52 is fixed. The contact surface 54 is provided with pyramid-shaped points that directly contact the flat connecting lines 4 during the final assembly and serve for delivering the current generated by the solar elements to a consumer.

The terminal ends of the spring elements 57 are realized in the form of pin-shaped terminal ends 56 and inserted into bores 36 in the printed circuit board 35, as well as soldered thereto.

The limbs of the spring elements are fixed and guided in longitudinal slots 31 of the cover plate 30, and the contact pin 52 is held in a guide bore 23 in the contact housing 20.

A negative polarization element 25 referred to the polarization element 15 provided in the contact plate 10 is arranged in the contact housing 20 between the two guide bores 23. Due to these polarization elements, the contact housing with the contact elements 50 can only be correctly attached to the contact plate 10 in the sandwich panel 1, 2, 3.

The cover plate 30 also contains outwardly directed catch hooks 33 that engage into openings 26 in the contact housing 20 when the cover plate 30 is installed on the contact housing 20 such that the contact housing 20 with the contact elements 50 and the cover plate 30 form one unit on the printed circuit board 35.

A central bore extends through the entire assembled structure comprising the contact housing 20, the cover plate 30 and the printed circuit board 35. When the connector housing is installed on the solar module, it is fixed in position with a screw 43 that extends through the bores 34, 32, 22 in the printed circuit board 35, the cover plate 30 and the contact housing 20.

Figure 5:
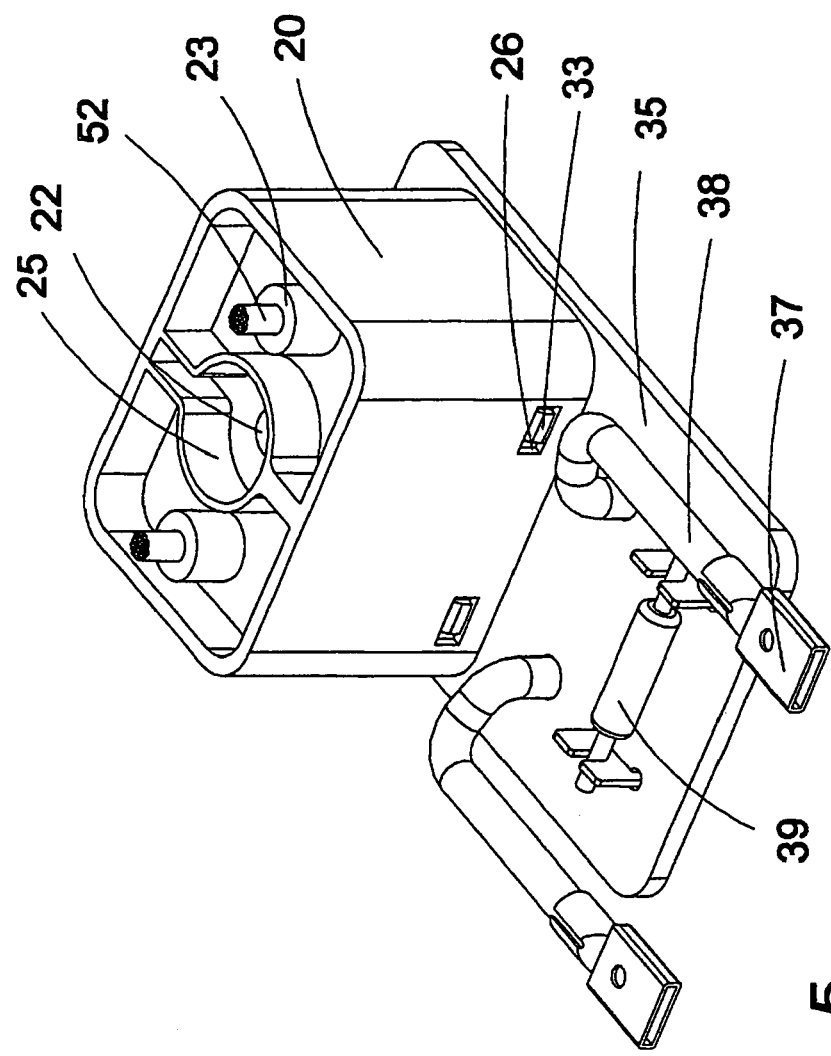
FIG. 5, a contact housing with contact pins installed on a printed circuit board.

FIG. 5 shows an assembled and interconnected housing 20 that is mounted on a printed circuit board 35. The contact elements with the contact pins 52 protrude from the contact housing, wherein both elements are able to axially slide in the guide bores 23 independently of one another due to the springable properties of the U-shaped spring element 57. The printed circuit board is also provided with connecting cables 38 with contacts 37. Components 39 may also be arranged on the printed circuit board.

Figure 6:
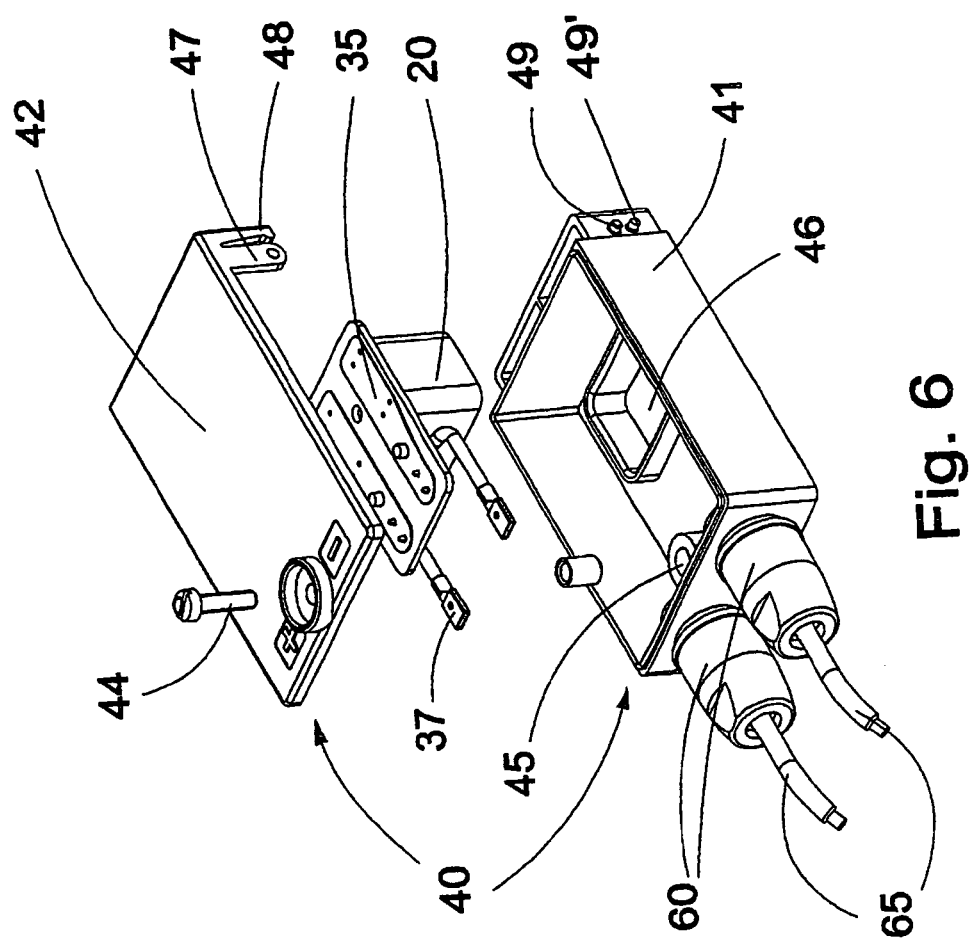
FIG. 6, an exploded view of the connector housing.

FIG. 6 shows an exploded view of a rectangular connector housing 40 that consists of a lower housing part 41 and a hinged housing cover 42.

The housing cover 42 is held in a pivoted fashion on the pins 49 with the aid of the limbs 47, and the limbs 48 in cooperation with the pin 49' cause the cover to be held in position when it is in the open state.

The lower housing part contains an opening 46, into which the contact housing 28 with the printed circuit board 35 is inserted. The contacts 37 need to be simultaneously connected to the connector plug 60.

The lower housing part and the housing cover can be tightly connected to one another by means of a screw 44 that is screwed into a threaded bore 45, as well as a peripheral seal between the housing and the cover that is not illustrated in greater detail. Due to these measures, the housing is largely protected from environmental influences.

Figure 7:
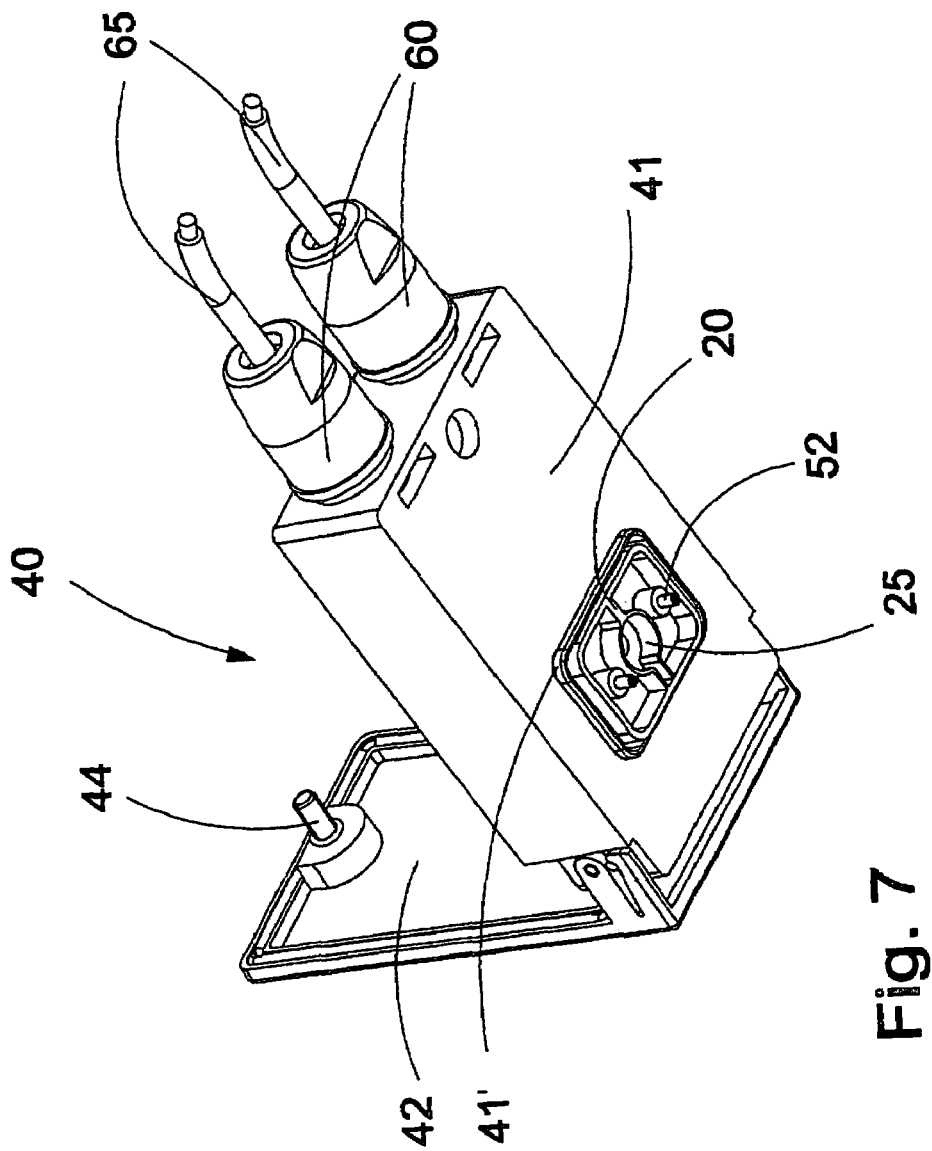
FIG. 7, a bottom view of the connector housing.

FIG. 7 shows a view of the connector housing 40 from the "bottom" that simultaneously forms the installation side to be placed on the contact plate 10 in the sandwich panel. One can ascertain that the contact housing 20 protrudes from the bottom of the connector housing, namely relative to the collar 41' that is integrally formed onto the bottom. The collar polarizes the connector housing in the recess 9 of the upper sheet 3, and the wall of the contact housing is centered on the contact plate within the collar 18.

Figure 8:
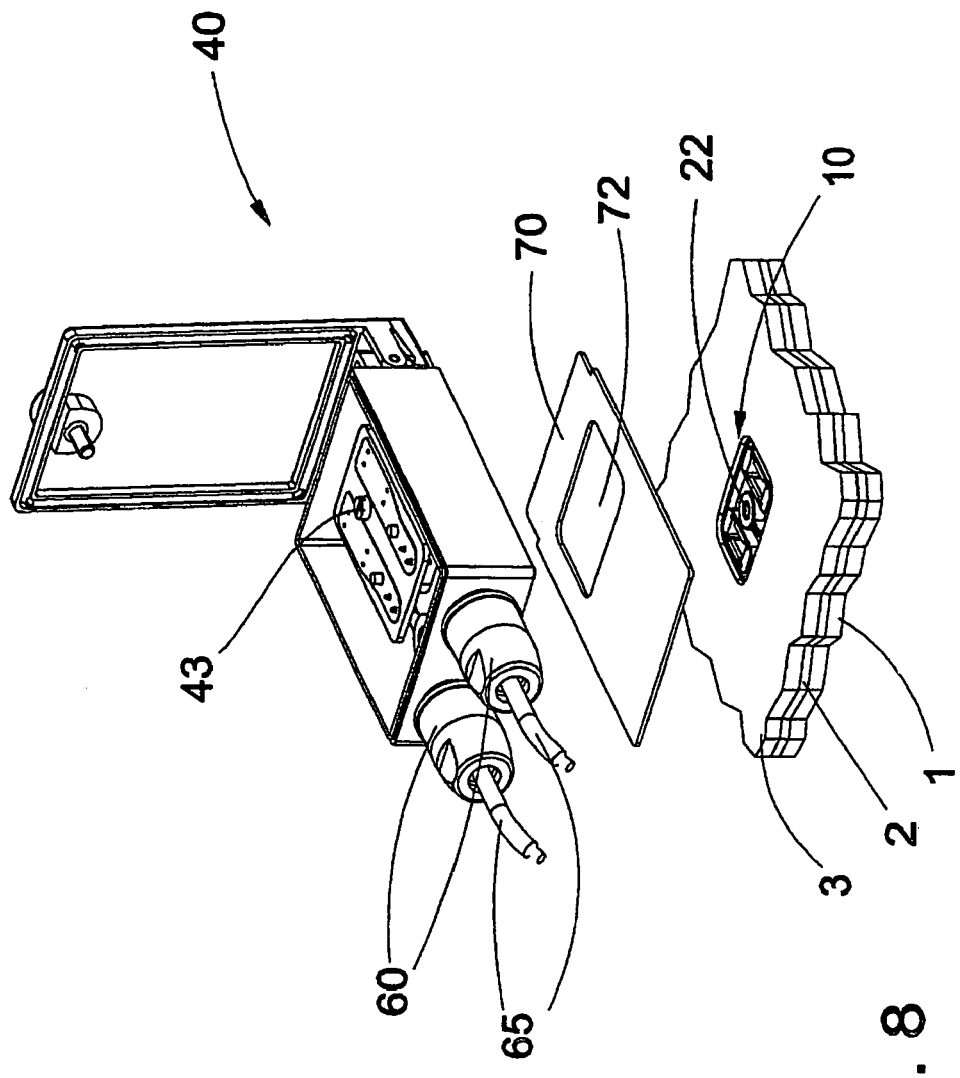
FIG. 8, a representation of the connector housing installed on the sandwich panel, and FIG. 9, a section through the connector housing with a connector plug.

The assembly of the connector housing is illustrated in FIG. 8. In this case, a double-sided adhesive foil 70 with a recess 72 for the region in which the collar 41' protrudes from the lower housing part, is initially attached to the bottom side of the lower housing part 41, and the connector housing 40 is subsequently placed on the region of the solar module, in which the contact plate 10 is fixed in the sandwich panel 1, 2, 3.

The connector housing 40 is initially placed on the sandwich panel without the contact housing 20. Subsequently, the contact housing is inserted and connected to the contact plate 10 by means of the screw 43.

Figure 9:
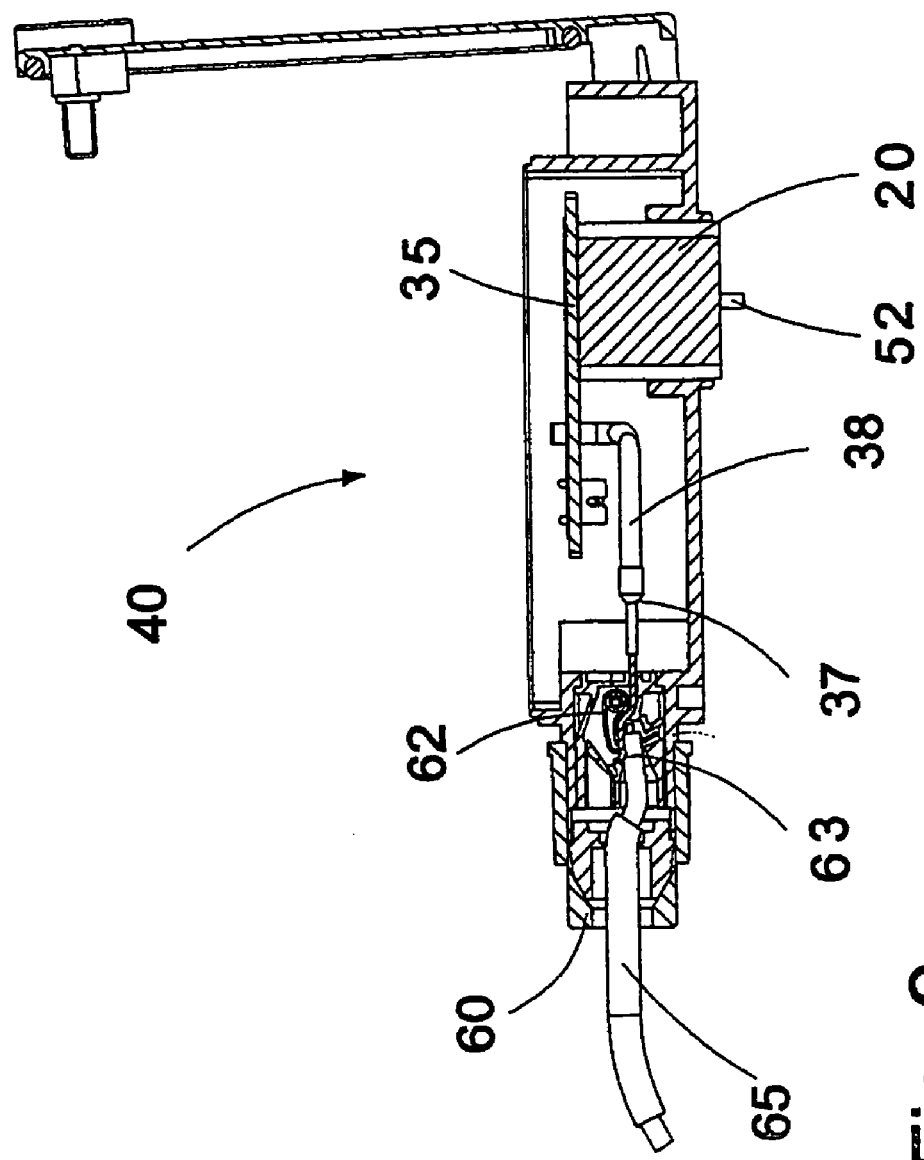

FIG. 9 shows a section through the open connector housing 40 in a region, in which one of the connector plugs 60 is connected to the connector housing.

One can ascertain how the current is supplied to the printed circuit board 35 via the protruding contact pin 52 in the contact housing 20, then to the contact 37 via the connecting cable 38 and ultimately to the region 63, in which the connector plug 60 is connected. In the embodiment shown, the connector plug is realized in the form of a cage strain terminal 62 that serves for delivering the current to the service cable 65 fixed in the cage strain terminal.

Instead of utilizing the cage strain terminal shown, it would also be conceivable to provide a connector with an axial terminal for bunched conductors in the connector plug 60.

The invention claimed is:

1. A solar module connector for connecting electric connecting lines of photovoltaic solar elements embedded in a translucent plastic layer sandwiched between inner and outer sheets comprising, in combination, a contact plate with reinforcing elements for contacting the connecting lines, a contact housing with a cover plate having power carrying contact elements, wherein the contact elements comprise outwardly fixed contact pins centrally arranged on an arc section of a spring element, and have a plurality of pyramid-shaped-points for contacting and pressing into the connecting lines, a connector housing containing said contact housing, and a connector plug for connection to a service cable.

2. The solar module connector according to claim 1, wherein the reinforcing elements are u-shaped and partially encompass the connecting lines, and wherein the reinforcing elements are provided with hooks that engage on an undercut within a rectangular recess in the contact plate.

3. The solar module connector according to claim 1, wherein the contact plate is fixed within a depression formed in the translucent plastic layer.

4. The solar module connector according to claim 1, wherein the spring elements each comprise two terminal ends that are respectively guided into a longitudinal slot of the cover plate for electrically connecting a printed circuit board.

5. The solar module connector according to claim 4, wherein the cover plate is interlocked with the contact housing, and the contact pins of the contact elements are guided in guide bores formed in the contact housing.

6. The solar module connector according to claim 1, wherein the contact housing, contact elements, cover plate and a printed circuit board are assembled as a unit and inserted into a rectangular opening in the connector housing.

7. The solar module connector according to claim 6, wherein the assembled unit is fixed on the inner sheet by a double-sided adhesive foil which covers the contact plate recess.

8. The solar module connector according to claim 1, wherein the connector plug is separably connected to the connector housing.

9. The solar module connector according to claim 1, wherein the connector housing comprises a lower housing part and a hinged housing cover.

* * * * *

UNITED STATES PATENT AND TRADEMARK OFFICE
CERTIFICATE OF CORRECTION

PATENT NO.       : 7,655,859 B2
APPLICATION NO.  : 10/883103
DATED            : February 2, 2010
INVENTOR(S)      : Naβ et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Thirtieth Day of November, 2010

David J. Kappos
*Director of the United States Patent and Trademark Office*